(12) United States Patent
Kim (10) Patent No.: US 8,193,022 B2
(45) Date of Patent: Jun. 5, 2012

(54) BACK SIDE ILLUMINATON IMAGE SENSOR AND METHOD FOR MANUFACTURING THE SAME

(75) Inventor: Mun Hwan Kim, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 193 days.

(21) Appl. No.: 12/641,010

(22) Filed: Dec. 17, 2009

(65) Prior Publication Data

US 2010/0164041 A1   Jul. 1, 2010

(30) Foreign Application Priority Data

Dec. 26, 2008 (KR) .................. 10-2008-0134583

(51) Int. Cl.
*H01L 21/00* (2006.01)

(52) U.S. Cl. ............ 438/48; 438/65; 257/E21.617; 257/E21.053

(58) Field of Classification Search ............ 438/48, 438/65, 69, 75, 128, 144; 257/E21.617, E21.053
See application file for complete search history.

(56) References Cited

U.S. PATENT DOCUMENTS

7,582,502 B1 * 9/2009 Hwang et al. .................. 438/59
* cited by examiner

*Primary Examiner* — Hoai V Pham
(74) *Attorney, Agent, or Firm* — Saliwanchik, Lloyd & Eisenschenk (57) ABSTRACT

A back side illumination image sensor according to an embodiment includes: a photosensitive device and a readout circuit on the front side of a first substrate; an interlayer dielectric layer on the front side of the first substrate; a metal line on the interlayer dielectric layer; a pad having a step on the interlayer dielectric layer; and a second substrate bonded with the front side of the first substrate over the interlayer dielectric layer, metal line, and pad.

7 Claims, 6 Drawing Sheets

BACK SIDE ILLUMINATON IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0134583, filed Dec. 26, 2008, which is hereby incorporated by reference in its entirety.

BACKGROUND

The present disclosure relates to a back side illumination image sensor.

Image sensors are semiconductor devices that convert optical images into electric signals and are generally classified as a CCD (Charge Coupled Device) image sensor or a CMOS image sensor (CIS).

A photodiode of a related art CIS is disposed on a substrate by an ion implantation process. As the size of the photodiode gradually decreases to increase the number of pixels without increasing the chip size, there is a growing tendency that image quality is reduced due to reduction of the area of an illumination part.

Further, since the stack height is not reduced as much as the reduction of the area of the illumination part, there is tendency that the number of photons entering the illumination part is reduced by diffraction of light, which is called "airy disk".

In order to address the above problem, there is provided a backside illumination image sensor, which receives light through a wafer backside to minimize a step difference at an upper portion of a light receiving section and avoid light interference caused by metal routing.

Figure 1:
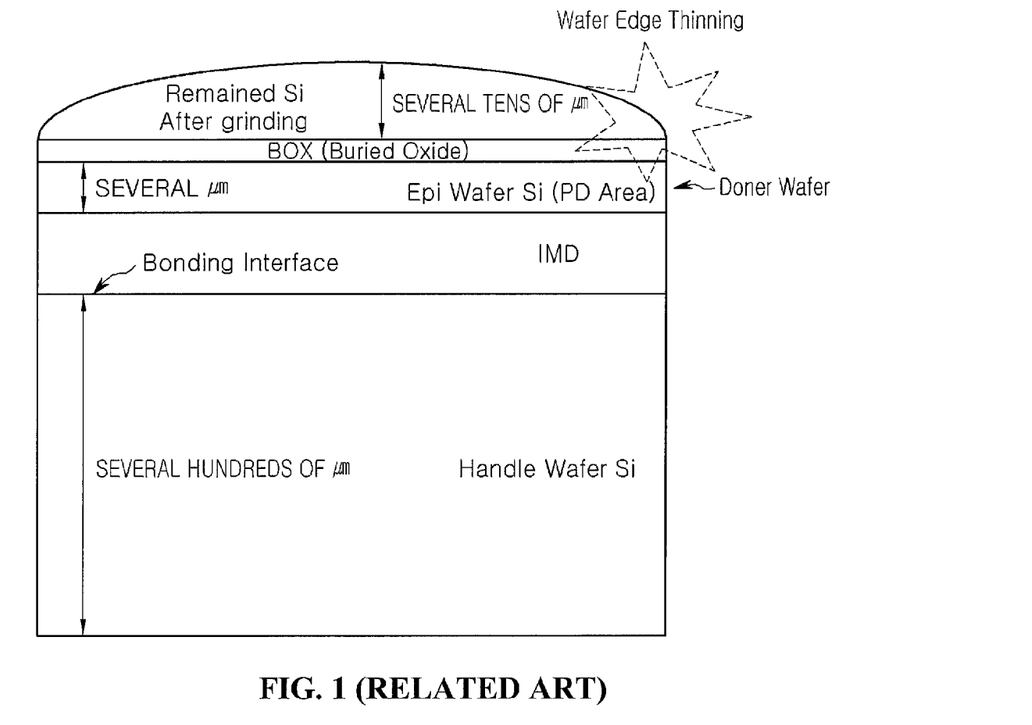
FIG. 1 is a cross-sectional diagram illustrating a back side illumination image sensor according to the related art.

FIG. 1 is a cross-sectional diagram illustrating a back side illumination image sensor according to the related art.

In the back side illumination image sensor according to the related art, an illumination device and interconnection are formed on the front side of a substrate and then a back grinding for removing the rear side of the substrate to a predetermined thickness is performed. This back grinding process of the rear side of the substrate is for fitting the gap between an external module and an optical lens to an appropriate thickness.

However, in the back side illumination sensor according to the related art, an SOI (Silicon On Insulator) wafer is used as a donor wafer where an illumination device and a circuit part are disposed, and then the SOI wafer is bonded to a handle wafer. Thereafter, a back side thinning process is applied to the donor wafer.

The backside thinning process that is applied to the donor wafer according to the related art is as follows.

First, the backside grinding process is applied to the donor wafer such that several tens of μm remains on the upper portion of a BOX (Buried Oxide) layer of the SOI wafer. Thereafter, the backside thinning process is completed by performing etch-back.

However, according to the related art, since an expensive SOI wafer is used for the donor wafer, the cost for the manufacturing process increases.

Further, according to the related art, as shown in FIG. 1, wafer edge thinning is generated by the backside grinding process of the donor wafer. Accordingly, a failure may occur in the chip at the wafer edge in the etch-back process performed after the backside grinding process, resulting in a problem that economical efficiency is considerably deteriorated.

Further, according to the related art, the wafer center is also exposed to plasma damage in the etch-back process of several tens of μm, resulting in a problem that sensor performance may be deteriorated.

Further, according to the related art, since a margin for opening a pad may be insufficient in a pad-opening process, there is a problem that a metal for the pad contact may be perforated or not opened.

Meanwhile, according to the related art, the photodiode may be deposited by using amorphous silicon. Otherwise, after a readout circuitry is formed on a silicon substrate, and the photodiode is formed on another wafer, the photodiode is formed over the readout circuitry through a wafer-to-wafer bonding scheme to form an image sensor (hereinafter, referred to as "3D image sensor"). In this case, the photodiode and the readout circuit are connected by a metal line.

However, according to the 3D-image sensor of the related art, when bonding the wafer with the readout circuit to the wafer with the photodiode, it can be difficult to completely electrically connect the readout circuit with the photodiode due to a problem relating to bonding. For example, according to the related art, a metal line is formed on the readout circuit and wafer-to-wafer bonding is performed such that the metal line contacts with the photodiode. However, not only does the metal line not completely contact with the photodiode, but it is difficult to implement an ohmic contact between the metal line and the photodiode. Further, according to the related art, a short may be generated in the metal line that is electrically connected with the photodiode. Accordingly, researches for preventing the short have been conducted, but the process becomes complicated.

BRIEF SUMMARY

Embodiments provide a back side illumination image sensor that makes it possible to stably and efficiently remove the rear side of the substrate in the back side illumination image sensor, and a method of manufacturing the back side illumination image sensor.

Further, embodiments provide a back side illumination image sensor that makes it possible to ensure stability in a process by ensuring a margin of a pad-open process, and a method of manufacturing the back side illumination image sensor.

Further, embodiments provide a back side illumination image sensor that makes it possible to considerably reduce the manufacturing cost, and a method of manufacturing the back side illumination image sensor.

Further, embodiments provide a back side illumination image sensor that makes it possible to maximize the amount of incident light by minimizing the stack on an illumination part while disposing a photosensitive device and a readout circuit on the same substrate, and makes it possible to inhibit interference and reflection of light due to metal routing, and a method of manufacturing the back side illumination image sensor.

A back side illumination image sensor according to an embodiment includes: a photosensitive device and a readout circuit on a front side of a first substrate; an interlayer dielectric layer on the front side of the first substrate; a metal line on the interlayer dielectric layer; a pad having a step on the interlayer dielectric layer; and a second substrate bonded with the front side of the first substrate above the interlayer dielectric layer and metal line.

Further, a method of manufacturing a back side illumination image sensor according to an embodiment includes: forming an ion implantation layer on a front side of a first substrate; forming a photosensitive device and a readout circuit on the front side of the first substrate where the ion implantation layer is formed; forming an interlayer dielectric layer on the front side of the first substrate; forming a metal line and a pad metal line on the interlayer dielectric layer; bonding a second substrate with the front side of the first substrate above the interlayer dielectric layer and metal line; and removing a lower part of the first substrate under the ion implantation layer.

Further, a method of manufacturing a back side illumination image sensor according to an embodiment includes: forming a photosensitive device on a front side of a first substrate; forming an ion implantation layer on the front side of the first substrate where the photosensitive device is formed; forming a readout circuit on the front side of the first substrate; forming an interlayer dielectric layer on the front side of the first substrate; forming a metal line and a pad metal line on the interlayer dielectric layer; bonding a second substrate with the front side of the first substrate above the interlayer dielectric layer and metal line; and removing a lower part of the first substrate under the ion implantation layer.

DETAILED DESCRIPTION

Hereinafter, a back side illumination image sensor according to an embodiment and a method of manufacturing the back side illumination image sensor will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 7:
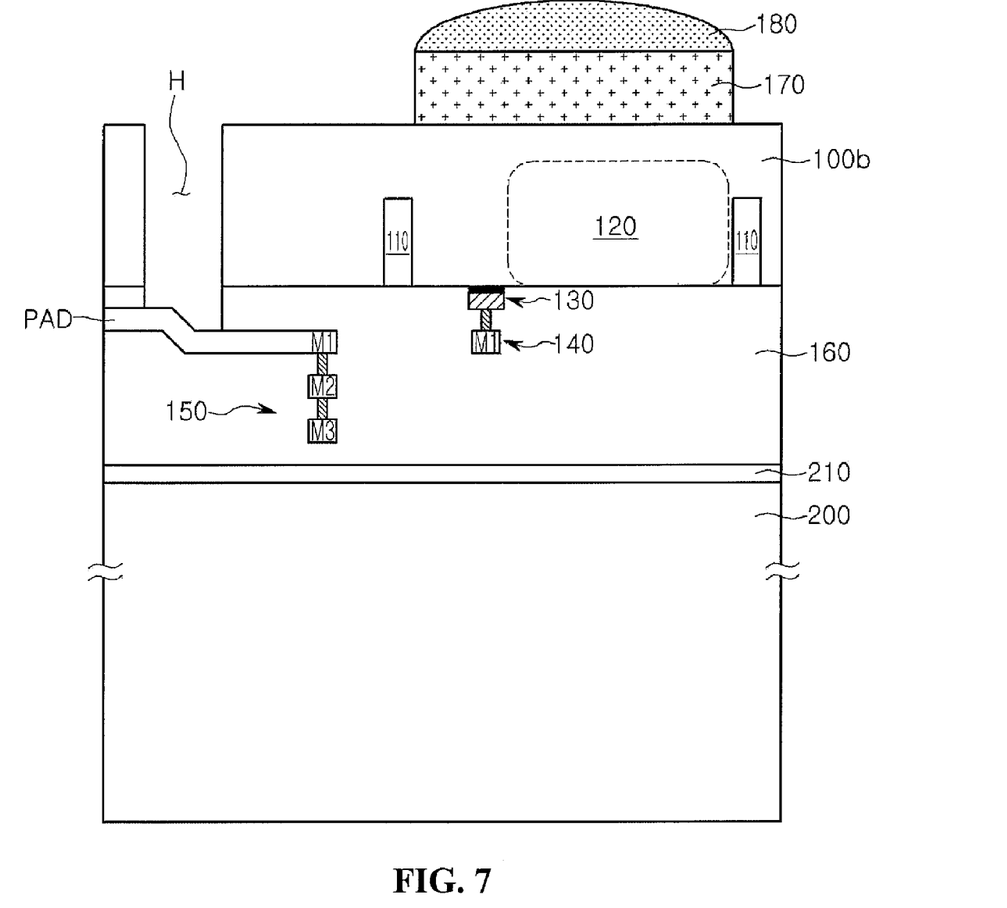

FIG. 7 is a cross-sectional view illustrating a back side illumination image sensor according to an embodiment.

A back side illumination image sensor according to an embodiment may include: a photosensitive device 120 and a readout circuit 130 on a front side of a first substrate 100; an interlayer dielectric layer 160 on the front side of the first substrate 100; a metal line 140 on the interlayer dielectric layer 160; a pad on the interlayer dielectric layer 160, the pad having a step; and a second substrate 200 that is bonded to the front side of the first substrate 100.

According to the back side illumination image sensor of an embodiment, it is possible to stably and efficiently remove the back side of the substrate using an ion implantation technology. That is, according to an embodiment, grinding and etchback are not needed by using the ion implantation and cleaving. Accordingly, problems of the related art, such as an edge die fail and plasma damage can be avoided.

Further, according to an embodiment, it is possible to ensure stability of a process by ensuring a margin of a pad-open process by forming the pad to have a step.

Hereinafter, a method of manufacturing a back side illumination image sensor according to an embodiment of the present invention will be described with reference to referring to FIGS. 2 to 7.

Figure 2A:
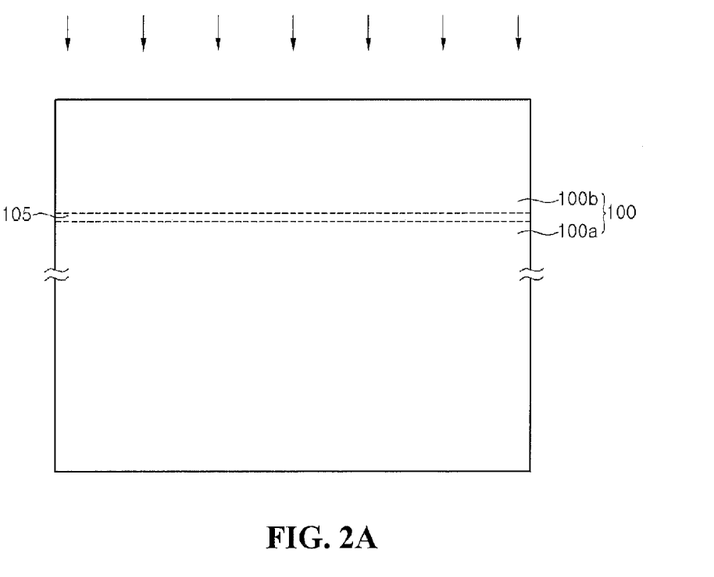
FIGS. 2 to 7 are cross-sectional diagrams illustrating a method of manufacturing a back side illumination image sensor according to an embodiment.
Figure 2B:
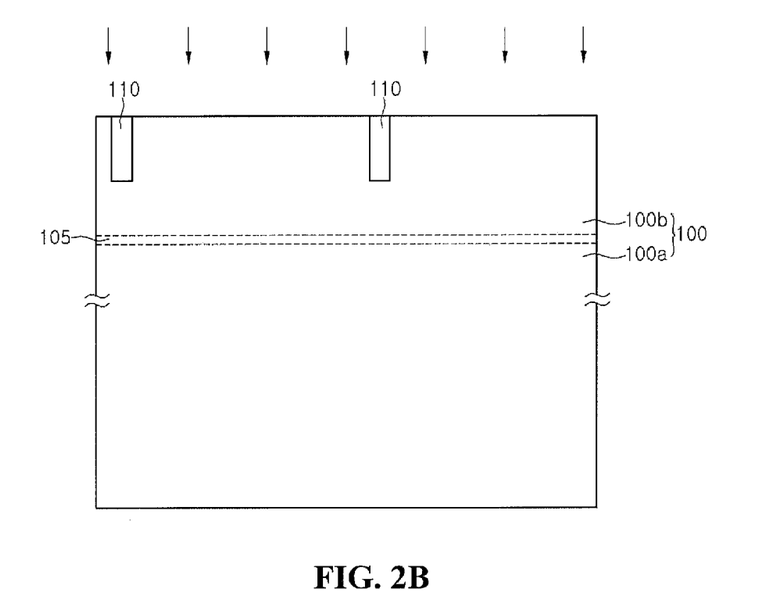
Figure 2C:
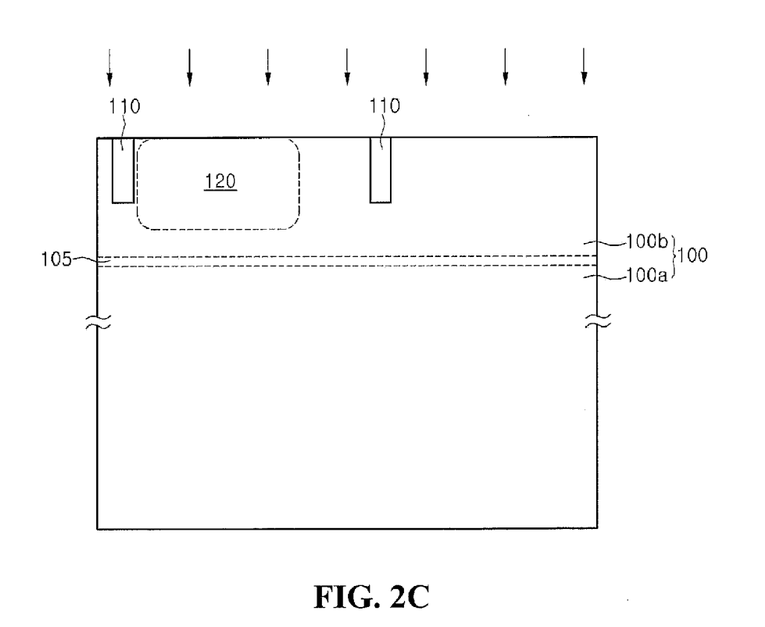

FIGS. 2A to 2C show example embodiments for forming an ion implantation layer 205. In one embodiment as shown in FIG. 2A, the implantation layer 205 is formed in the front side of a first substrate 100 before forming device structures. In another embodiment as shown in FIG. 2B, the ion implantation layer 205 is formed after defining active areas by forming device isolation regions 110 in the first substrate 100. In yet another embodiment as shown in FIG. 2C, the ion implantation layer is formed after forming a photosensitive device 120 in the first substrate 100.

First, as shown in FIG. 2A, an ion implantation layer 105 may be formed on the front side of a first substrate 100. The first substrate 100 may be an epi wafer, but is not limited thereto. The first substrate 100 can be divided into a lower part 100a of the first substrate and an upper part 100b of the first substrate by the ion implantation layer 105.

In a method of manufacturing a back side illumination image sensor according to an embodiment, an epi wafer can be used as the donor wafer. Using the epi wafer can considerably reduce the manufacturing cost as compared with using an SOI wafer.

Further, according to an embodiment, the epi wafer can be used as the donor wafer and the photosensitive device and the circuit device can be formed together on the epi wafer. Therefore, the manufacturing is easy by not using a bonding process of a 3D-image sensor for forming a photodiode over a circuit. Thus, problems relating to bonding and contacting are removed.

The ion implantation layer 105 may be provided by performing ion implantation to the front side of the first substrate 100. It is preferable to perform ion implantation through the front side, because the back side of the first substrate 100 is a few hundred μm.

That is, since the thickness of the first substrate 100 is very large relative to the depth of the ion implantation, it is difficult to perform ion implantation through the back side of the first substrate 100. According to the embodiment, by forming in advance the ion implantation layer 105 before the process of forming the metal line 140 or bonding with the second substrate 200, it is possible to easily remove the lower part 100a of the first substrate after bonding.

The process of forming the ion implantation layer 105 can be performed by implanting ions, such as hydrogen (H) or helium (He), but it is not limited thereto.

Alternatively, according to one embodiment, it is possible to form the ion implantation layer 105 after forming a device isolation region 110 on the front side of the first substrate 100, as shown in FIG. 2B. For example, a pixel region is defined by forming the device isolation region 110 on the front side of the first substrate 100. Thereafter, the ion implantation layer 105 can be formed. The device isolation region 110 can be formed of STI.

According to the embodiment, it is possible to significantly increase the manufacturing yield of the back side illumination image sensor, by easily and stably removing the back side of the substrate using the ion implantation layer 105 formed in advance, and not removing the back side of the substrate by grinding.

Further, according to the embodiment, an ion implantation process of hydrogen or helium is performed to form the ion implantation layer 105, which is a cleaving layer, during the processes on the epi wafer. Then the first substrate 100 that is a donor wafer is bonded to the second substrate 200 that is a handle wafer after a process for the first substrate 100 is finished. The cleaving layer can be used to remove the lower part. Since the first substrate 100 that is a donor wafer with the lower part removed is thin after bonding, the second substrate 200 functions as a handle wafer to smoothly progress subsequent processes such as a color filter process, etc.

According to an embodiment, grinding and etch-back are not needed by using ion implantation and cleaving. Accordingly, there is an advantage of not generating problems of the related art, such as an edge die fail and plasma damage.

Further, according to the embodiment, since grinding is not applied to the donor wafer, physical stress is not applied to the donor wafer, such that it is possible to inhibit damage to the photosensitive device and the readout circuit.

Alternatively, according to another embodiment, as shown in FIG. 2C, it is possible to form the ion implantation layer 105 after forming the photosensitive device in the pixel region. The photosensitive device 120 may be a photodiode, but is not limited thereto. The photosensitive device 120 can be achieved by forming an N-type ion implantation region 120 on a P-type first substrate 100 and forming a Po region (not shown) on the N-type ion implantation region 120 of the first substrate, but it is not limited thereto. Extra electrons can be inhibited by the Po region. Further, according to an embodiment, it is possible to achieve a charge dumping effect by forming the PNP junction for the photosensitive device 120.

Figure 3:
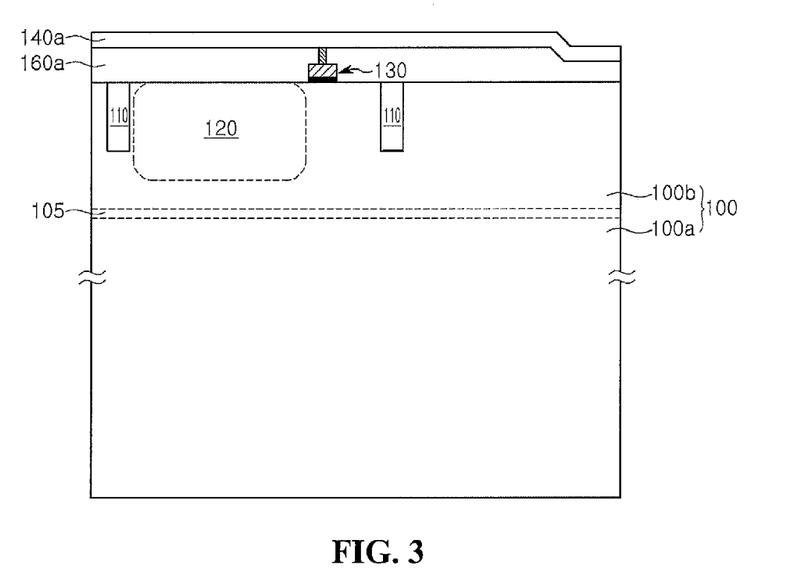

Referring to FIG. 3, after forming the ion implantation layer 105, device isolation region 110, and the photosensitive device 120, as shown in FIG. 3, a readout circuit 130, which is a circuit device, is formed on the first substrate 100 where the photosensitive device 120 is formed. The readout circuit 130 may include a transfer transistor, a reset transistor, a drive transistor, and a select transistor, but is not limited thereto.

According to an embodiment, an epi wafer can be used as the first substrate 100, which is a donor wafer, and the photosensitive device 120 and the readout circuit 130 can be formed together on the first substrate 100. Therefore, a bonding process of a 3D-image sensor which forms a photosensitive device over a circuit is not needed. Accordingly, the manufacturing is easy and problems relating to bonding and contacting are removed. Meanwhile, the handle wafer and the donor wafer can be bonded with a dielectric layer, such as an interlayer dielectric layer, therebetween, resulting in fewer issues in bonding.

Further, according to the embodiment, it is possible to maximize the amount of incident light by minimizing the stack on the illumination part, and interference and reflection of light due to metal routing are removed. Accordingly, it is possible to optimize the optical characteristic of the image sensor.

Figure 4:
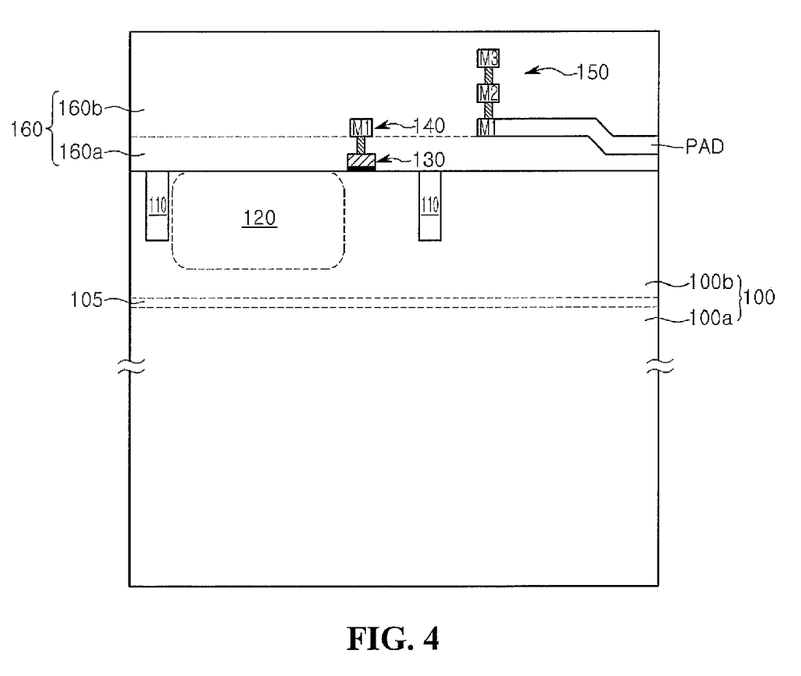

Referring to FIGS. 3 and 4, an interlayer dielectric layer 160 and a metal line 140 are formed on the first substrate 100. The metal line 140 may include a first metal M1, a second metal M2, etc.

In addition, according to the embodiment, a pad metal line 150 can be formed on a logic region. The pad metal line 150 may include the first metal M1, a second metal M2, and a third metal M3, but is not limited thereto. In this configuration, the pad can be formed at the same level as the first metal M1. Accordingly, a pad-open process can be easily applied to the back side of the first substrate 100 after the first substrate 100 is bonded with the second substrate 200. This is because the depth from the back side of the first substrate 100 to the pad is small.

Further, according to an embodiment, as shown in FIGS. 3 and 4, in forming the pad of the pad metal line 140, it is possible to ensure a margin of the pad-open process by forming the pad to have a step. As the first metal M1 is formed lower than the second metal M2 and the third metal M3, the first metal M1 functions as a pad. The first metal M1 for the pad may be perforated or not opened due to the process margin in the pad-open process. Therefore, according to the embodiment, the pad is formed to have a step to inhibit this problem from occurring. Accordingly, it is possible to ensure stability in the pad-open process by ensuring a margin of the pad-open process.

Hereinafter, a process of forming a pad with a step will be described in detail with reference to FIGS. 3 and 4.

First, as shown in FIG. 3, a step is established by removing a portion of a first interlayer dielectric layer 160*a* at a part of a region where the pad will be formed. The first interlayer dielectric layer 160*a* can be the interlayer dielectric covering the readout circuit 130.

Thereafter, a first metal metal layer 140*a* is formed on the first interlayer dielectric layer 160*a* with the step.

Next, as shown in FIG. 4, the first metal M1 of the metal line 140 and the pad PAD with the step are formed by patterning the metal layer 140*a*.

Subsequently, a second interlayer dielectric layer 160*b* is formed on the first metal M1 of the metal line 140 and the pad PAD, and the other metal lines (not shown) for the metal line 140 and a pad metal line 150 are formed.

Figure 5:
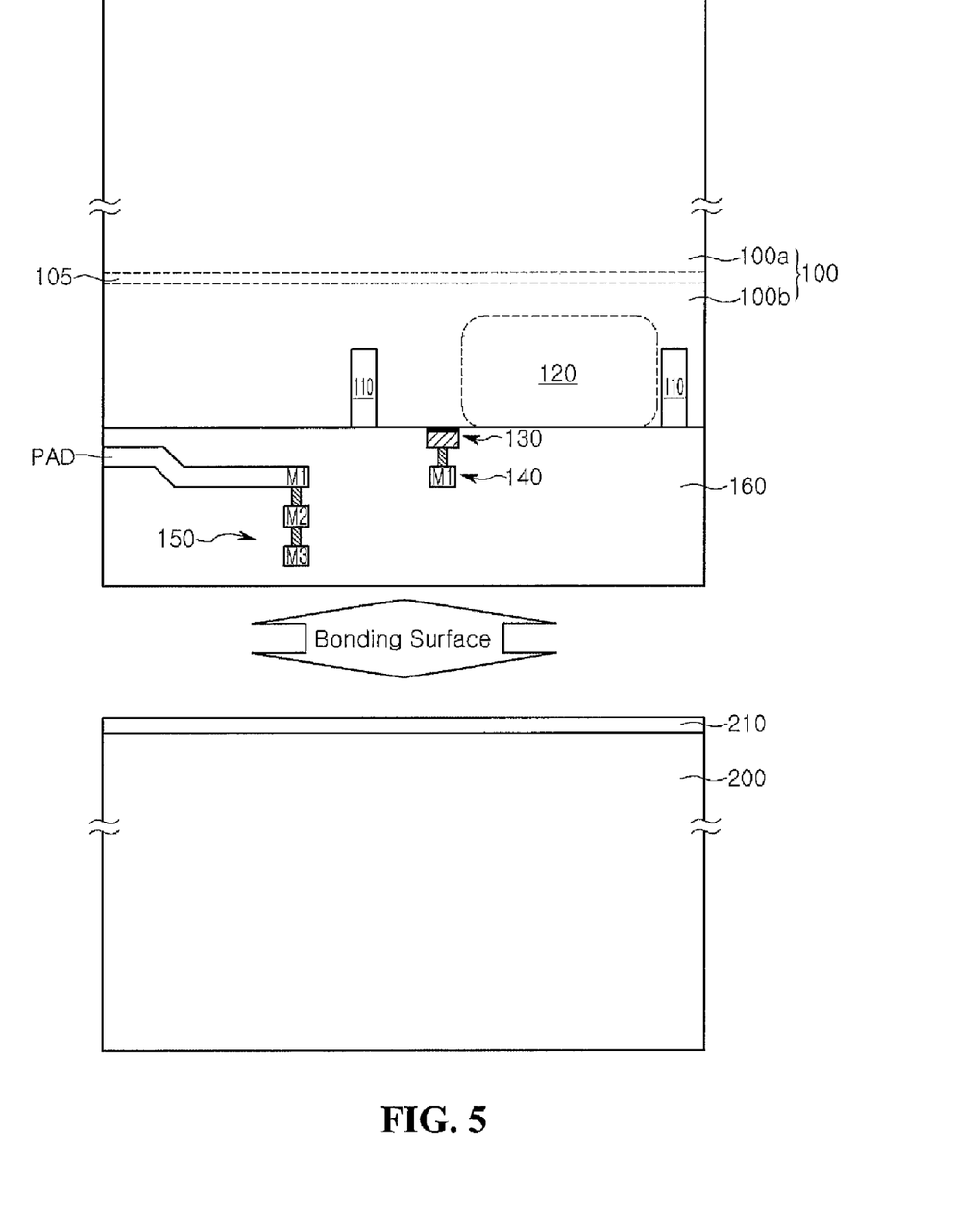

Next, as shown in FIG. 5, a second substrate 200 can be bonded with the front side of the first substrate 100 with the metal lines 140, 150. For example, the second substrate 200 that is a handle wafer can be bonded to correspond to the metal line 140 of the first substrate 100.

According to the embodiment, it is possible to increase the bonding force with the first substrate by forming a dielectric layer on the upper surface of the second substrate 200 that is bonded with the first substrate 100. The dielectric layer 210 may be an oxide layer or a nitride layer, but is not limited thereto. Bonding is performed with the dielectric layer 210 contacting with the interlayer dielectric layer 160, which is on the front side of the first substrate 100, such that the bonding force between the first substrate 100 and the second substrate 200 can be considerably increased.

Figure 6:
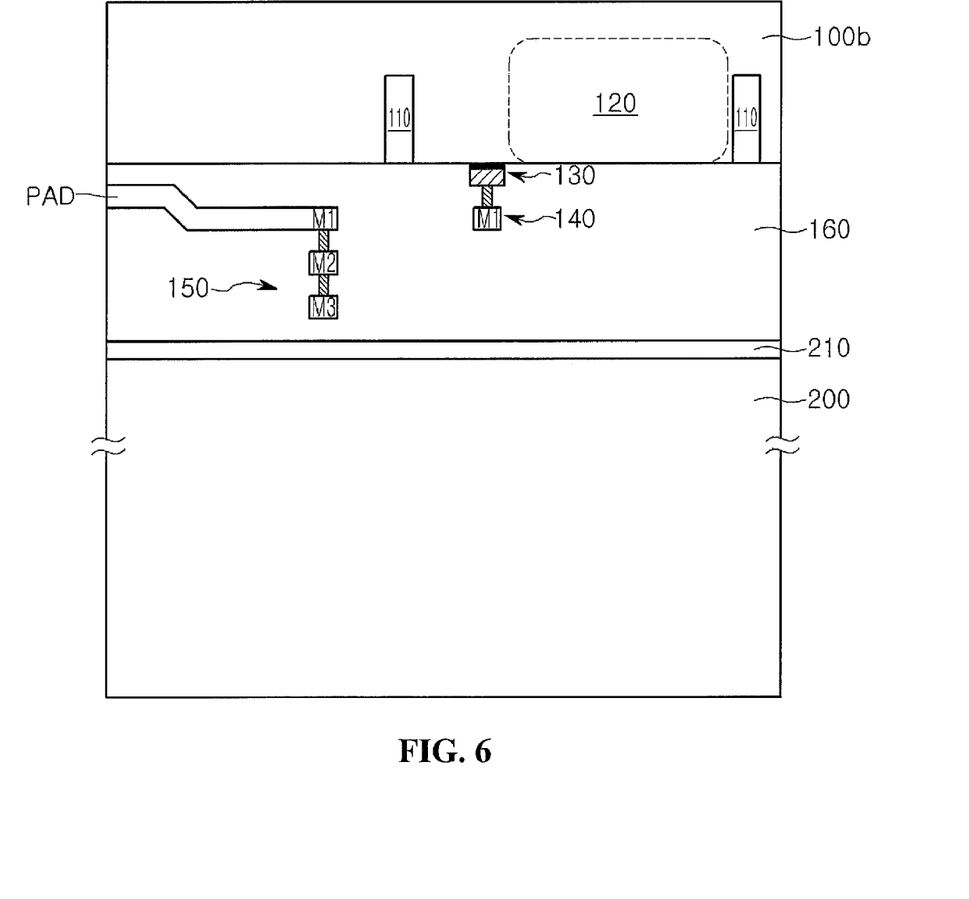

Next, in the first substrate 100 bonded as shown in FIG. 5, the lower part 100*a* of the first substrate under the ion implantation layer 105 is removed as shown in FIG. 6. For example, the upper part 100*b* of the first substrate can remain by bubbling the hydrogen ions by applying heat treatment to the ion implantation layer 105, and cutting and removing the lower part 100*a* of the first substrate with a blade. Thereafter, planarization can be applied to the cut surface of the first substrate 100.

Meanwhile, in patents relating to a 3D-image sensor using a cleaving technology of the related art, in general, a photosensitive device and a readout circuit are formed at individual wafers and then bonding and interconnection are performed. In the related art an ion implantation of hydrogen or helium for forming a cleaving layer is performed right before bonding.

However, according to the related art 3D-image sensor, it is difficult to completely electrically connect the readout circuit and the photodiode, and there is a problem that a short is generated in a metal line that is electrically connected with the photodiode.

In contrast, according to an embodiment, an epi wafer can be used as the first substrate 100, which is a donor wafer, and the photosensitive device 120 and the readout circuit 130 can be formed together on the first substrate 100. Therefore, a bonding process between the substrate with the photosensitive device and the substrate with a circuit as in a 3D-image sensor which forms a photosensitive device over a circuit is not needed, resulting in a simpler manufacturing process and avoidance of problems relating to bonding and contacting.

Meanwhile, according to the 3D image sensor of the related art, hydrogen ions may be implanted just before the bonding process. That is, electrons generated from the photodetector are transferred to an electronic circuit section formed on another wafer so that the voltage is changed. Thus, according to the related art, it is not necessary to form the metal line and the interlayer dielectric layer on the wafer with the photodetector, enabling the implantation of the hydrogen ions just before the bonding process for the related art sensor.

In contrast, according to the embodiment, the photosensitive device 120 and the readout circuit 130 are formed on the same wafer, that is, the first substrate 100. Therefore, according to the embodiment, since the photosensitive device 120 and the readout circuit 130 are on the same first substrate 100, post-processes, such as forming the metal line 140 and the interlayer dielectric layer 160, are necessary.

Accordingly, when the process scheme of embodiments of the invention is used, it is not possible to perform the ion implantation using hydrogen or helium right before bonding. Instead, the ion implantation layer 105 is formed by performing ion implantation of hydrogen or helium before forming the metal line 140 and the interlayer dielectric layer 160 over the epi wafer of the first substrate 100 (donor wafer).

Next, as shown in FIG. 7, a color filter 170 can be formed over the photosensitive device 120 on the back side of the first substrate 100. Meanwhile, for certain embodiments such as where the photosensitive device 120 is an R-G-B-vertical-stacked type photodiode, the color filter may be omitted.

In addition, a microlens 180 can be formed on the color filter 170.

Further, a process of opening the pad can be performed. The pad opening process can be performed subsequently to forming the microlens 180. According to embodiments, it is possible to apply a process of opening the pad to the back side of the first substrate 100. According to an embodiment, since the pad is formed at the level of the first metal M1, it is possible to easily open the pad from the back side of the first substrate 100.

According to the back side illumination image sensor of an embodiment and a method of manufacturing the back side illumination image sensor, it is possible to stably and efficiently remove the back side of the substrate using an ion implantation technology. That is, according to an embodiment, grinding and etch-back are not needed by using ion implantation and cleaving. Accordingly, there is an advantage of not generating problems of the related art, such as an edge die fail and plasma damage.

Further, according to an embodiment, it is possible to ensure stability of a process by ensuring a margin of a pad-open process by forming the pad to have a step.

Further, according to an embodiment, since grinding is not applied to the donor wafer, it is possible to prevent inhibit to the photosensitive device and the circuit device.

Further, according to an embodiment, the photosensitive device and the circuit device can be formed together on the epi wafer that is used as the donor wafer. Therefore, according to an embodiment, it is possible to considerably reduce the manufacturing cost by using the epi wafer, as compared with using an SOI wafer.

Further, according to an embodiment, the epi wafer can be used as the donor wafer, and the photosensitive device and the circuit device can be formed together on the epi wafer. Therefore, the manufacturing is easy without requiring a bonding process of a 3D-image sensor, which forms a photodiode over a circuit, and problems relating to bonding and contacting can be removed. Meanwhile, the handle wafer and the donor wafer are bonded with a dielectric layer, such as an interlayer dielectric layer therebetween resulting in fewer issues in bonding.

Further, according to an embodiment, it is possible to maximize the amount of incident light by minimizing the stack on the illumination part, and remove interference and reflection of light due to metal routing, such that it is possible to optimize light characteristics of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a back side illumination image sensor, comprising:
    forming an ion implantation layer in a front side of a first substrate;
    forming a photosensitive device and a readout circuit on the front side of the first substrate above where the ion implantation layer is formed;
    forming an interlayer dielectric layer on the front side of the first substrate over the photosensitive device and the readout circuit;
    forming a metal line and a pad metal line on the interlayer dielectric layer;
    bonding a second substrate with the front side of the first substrate over the metal line and pad metal line; and
    removing a lower part of the first substrate under the ion implantation layer;
    wherein a first metal of the metal line and a pad of the pad metal line are formed at the same metal level, in the forming of the metal line and the pad metal line; and
    wherein the pad is formed to have a step, in the forming of the pad of the pad metal line.

2. The method of manufacturing the back side illumination image sensor according to claim 1, wherein the forming of the ion implantation layer and the forming of the photosensitive device and the readout circuit comprises:
- forming the photosensitive device on the front side of the first substrate;
- forming the ion implantation layer by implanting ions into the first substrate after forming the photosensitive device; and
- forming the readout circuit on the front side of the first substrate after forming the ion implantation layer.

3. The method of manufacturing the back side illumination image sensor according to claim 1, wherein the ion implantation layer is formed before forming the photosensitive device and the readout circuit.

4. The method of manufacturing the back side illumination image sensor according to claim 1, wherein the forming of the interlayer dielectric layer and the forming of the metal line and the pad metal line comprises:
- forming a first interlayer dielectric layer on the front side of the first substrate;
- removing a portion of the first interlayer dielectric layer at a part of a region where a pad of the pad metal line will be formed;
- forming a first metal metal layer on the first interlayer dielectric layer having the portion removed;
- forming a first metal of the metal line and the pad of the pad metal line by patterning the metal layer, the pad being formed on the first interlayer dielectric layer overlapping the removed portion of the first interlayer dielectric layer to have a step; and
- forming a second interlayer dielectric layer on the first metal and the pad.

5. The method of manufacturing the back side illumination image sensor according to claim 1, further comprising opening the pad after the removing of the lower part of the first substrate under the ion implantation layer.

6. The method of manufacturing the back side illumination image sensor according to claim 5, wherein the opening of the pad is performing a process of opening the pad to the back side of the first substrate.

7. The method of manufacturing the back side illumination image sensor according to claim 1, wherein the forming of the ion implantation layer comprises implanting hydrogen or helium ions into the first substrate through the front side of the first substrate.

* * * * *